(12) United States Patent
Endoh et al.

(10) Patent No.: US 7,141,506 B2
(45) Date of Patent: Nov. 28, 2006

(54) METHOD FOR EVALUATING DEPENDENCE OF PROPERTIES OF SEMICONDUCTOR SUBSTRATE ON PLANE ORIENTATION AND SEMICONDUCTOR DEVICE USING THE SAME

(75) Inventors: Tetsuo Endoh, Natori (JP); Fujio Masuoka, 2-33-18, Higashikatsuyama, Aoba-ku, Sendai-shi, Miyagi (JP); Noboru Takeuchi, Fukuyama (JP); Takuji Tanigami, Fukuyama (JP); Takashi Yokoyama, Sendai (JP)

(73) Assignees: Sharp Kabushiki Kaisha, Osaka (JP); Fujio Masuoka, Miyagi (JP)

( * ) Notice: Subject to any disclaimer, the term of this patent is extended or adjusted under 35 U.S.C. 154(b) by 248 days.

(21) Appl. No.: 10/175,076

(22) Filed: Jun. 20, 2002

(65) Prior Publication Data
US 2002/0197868 A1    Dec. 26, 2002

(30) Foreign Application Priority Data
Jun. 22, 2001    (JP)    ............................. 2001-190277

(51) Int. Cl.
H01L 21/302    (2006.01)

(52) U.S. Cl. ...................... 438/710; 438/248; 438/706; 438/719

(58) Field of Classification Search ................ 438/706, 438/710, 712, 720, 243, 245, 259, 714, 719
See application file for complete search history.

(56) References Cited
U.S. PATENT DOCUMENTS

| | | | |
|---|---|---|---|
| 4,309,813 A | 1/1982 | Hull | |
| 4,470,875 A | 9/1984 | Poteat | |
| 5,929,477 A | 7/1999 | McAllister Burns, Jr. et al. | |
| 6,107,670 A | 8/2000 | Masuda | |
| 6,114,767 A | 9/2000 | Nagai et al. | |
| 6,150,670 A * | 11/2000 | Faltermeier et al. | .......... 257/77 |
| 6,165,840 A * | 12/2000 | Choi et al. | .................. 438/253 |
| 6,218,262 B1 * | 4/2001 | Kuroi et al. | ................ 438/401 |
| 6,335,247 B1 * | 1/2002 | Tews et al. | ................. 438/270 |
| 6,387,757 B1 | 5/2002 | Chu et al. | |
| 6,403,427 B1 * | 6/2002 | Blanchard | .................... 438/294 |
| 6,426,254 B1 * | 7/2002 | Kudelka et al. | ........... 438/246 |
| 6,433,382 B1 | 8/2002 | Orlowski et al. | |
| 6,483,136 B1 | 11/2002 | Yoshida et al. | |
| 6,501,125 B1 | 12/2002 | Kobayashi | |
| 6,593,231 B1 | 7/2003 | Endoh et al. | |
| 2002/0036308 A1 | 3/2002 | Endoh et al. | |
| 2002/0154556 A1 | 10/2002 | Endoh et al. | |

(Continued)

FOREIGN PATENT DOCUMENTS

JP    01-287470    11/1989

(Continued)

OTHER PUBLICATIONS

XP-002337036 "Thermal Oxidation of Single Crystal Silicon", pp. 211-213, no dates.

(Continued)

*Primary Examiner*—Lan Vinh
(74) *Attorney, Agent, or Firm*—Nixon & Vanderhye P.C.

(57) ABSTRACT

A method for evaluating a plane orientation dependence of a semiconductor substrate comprises: forming a hard mask on a semiconductor substrate having plane orientation (100); anisotropically etching the semiconductor substrate with use of the hard mask as a mask to obtain a surface oriented in a specific crystal orientation; and evaluating a plane orientation dependence of the semiconductor substrate by use of at least a portion of the surface oriented in a specific crystal orientation.

8 Claims, 17 Drawing Sheets

U.S. PATENT DOCUMENTS

2002/0195668 A1    12/2002    Endoh et al.

FOREIGN PATENT DOCUMENTS

| JP | 0 618 615 | 10/1994 |
| JP | 7-283117 A | 10/1995 |
| JP | 08-130230 | 5/1996 |
| JP | 08-167586 | 6/1996 |
| JP | 10-154810 A | 6/1998 |
| JP | 2001-093836 | 4/2001 |

OTHER PUBLICATIONS

XP-001028555 "Precise Mask Alignment to the Crystallographic Orientation of Silicon Wafers Using Wet Anisotropic Etching", Vangbo et al., 1996 IOP Publishing Ltd, pp. 279-284.

"Alignment of Mask Patterns to Crystal Orientation", Ensell, 1996 Elsevier Science S.A., pp. 345-348.

XP-001030488 "Precise Mask Alignment Design to Crystal Orientation (100) Silicon", Chen et al., Proceedings of SPIE vol. 4174, pp. 462-466, 2000.

* cited by examiner

Fig. 4(a)
Fig. 4(b)
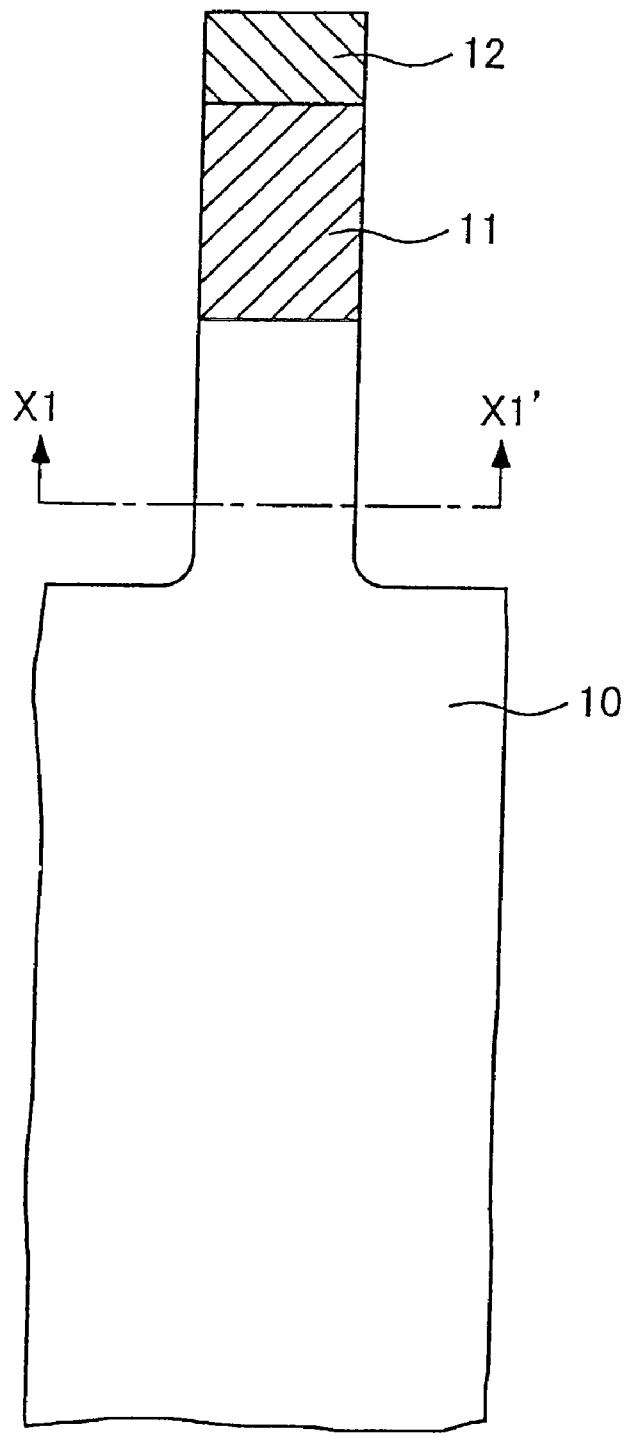
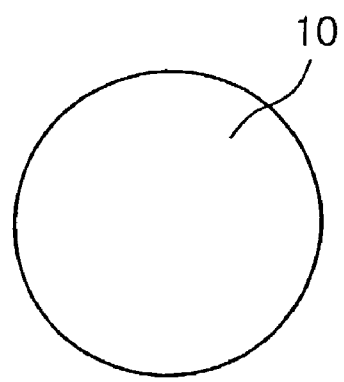

METHOD FOR EVALUATING DEPENDENCE OF PROPERTIES OF SEMICONDUCTOR SUBSTRATE ON PLANE ORIENTATION AND SEMICONDUCTOR DEVICE USING THE SAME

CROSS-REFERENCE TO RELATED APPLICATION

This application is related to Japanese application No. 2001-190277 filed on Jun. 22, 2001, whose priority is claimed under 35 USC § 119, the disclosure of which is incorporated by reference in its entirety.

BACKGROUND OF THE INVENTION

1. Field of the Invention

The present invention relates to a method for evaluating a dependence of properties of a semiconductor substrate on a plane orientation (referred to as plane orientation dependence) and a semiconductor device manufactured using the method.

2. Description of the Prior Arts

The plane orientation is an important factor in physical properties of a crystalline semiconductor (e.g., silicon, etc.,) substrate including a rate of thermal oxidation, a rate of etching, electron mobility and the like. In particular, the plane orientation gives a great influence to the rate of thermal oxidation, i.e., a growth rate for a thermal oxidation film formed on a surface of a silicon substrate. The rate of thermal oxidation is the slowest on a surface of the silicon substrate having plane orientation (100), faster on a surface thereof having plane orientation (111) and still faster on a surface thereof having plane orientation (110). Therefore, the thickness of thermal oxide films is uneven unless they are formed on surfaces having the same plane orientations.

There is no problem in the case where a gate oxide film is formed only on a surface of a silicon wafer such as known MOSFET. However, it is important to obtain a gate oxide film of a uniform thickness in a device wherein the gate oxide film is three-dimensionally arranged, for example, in a trench-type vertical power MOSFET shown in FIG. 16. Therefore, in order to avoid an area where dielectric voltage is reduced, attempts have been made for matching all plane orientations of areas having formed thereon the gate oxide films by putting some thought into the arrangement of elements (chips) on the substrate (see Japanese Unexamined Patent Application No. HEI10-154810).

As understood from the above, it is important to determine the plane orientation of the substrate itself and evaluate the plane orientation dependence before manufacturing a device.

One of the conventional popular methods for evaluating the plane orientation dependence of a substrate is as follows. Wafers having different plane orientations are prepared by cutting out from silicon ingots having various plane orientations. These wafers are thermally oxidized actually and respectively, and the plane orientation dependence is evaluated by the rate of thermal oxidation.

However, this method entails a problem that the impurity concentration or the like is within specs but may be different in lots of ingots. This causes different rates of thermal oxidation, and therefore, the method is poor in precision for evaluating the plane orientation dependence.

Another conventional popular method for determining the plane orientation of a substrate is as follows. In manufacturing a semiconductor device, a reference pattern for mask alignment is formed in advance, and then, a mark pattern for a photomask alignment is matched to the reference pattern. The reference pattern is formed on a basis of an orientation flat or a notch (a V-shaped cut-out formed in an outer peripheral section of the silicon wafer) of the wafer. The orientation flat or notch is formed to provide a nominal reference plane by cutting a portion of the outer peripheral section of the wafer along a crystal orientation upon manufacturing the wafer.

The orientation flat formed on the silicon wafer having plane (100) provides a nominal plane (110). The edge, e.g., the corner, between plane (100) and orientation flat (110) of the silicon wafer has orientation <110>. The orientations generally exhibit precision with a margin of approximately plus or minus 2 degrees with respect to the true crystal orientation.

In other words, even if the orientation flat are accurately aligned in position with the mark pattern of the photomask, a deviation of 2° at the maximum may actually occur between the mark pattern for the photomask alignment and the true crystal orientation. Therefore, the plane orientation of the substrate cannot be determined accurately because the amount of deviation varies in every silicon wafer.

In order to eliminate such a positional deviation, Japanese Unexamined Patent Publication No. HEI 7(1995)-283117 discloses a photomask alignment method for determining a crystallographic reference orientation of a silicon wafer with high precision. This method does not use a cut line of the orientation flat as a reference for alignment of crystal orientation, but uses another means. The method will be explained with reference to FIG. 17.

Firstly, a silicon oxide film 72 is formed as an etching mask layer on a silicon wafer having plane (100). Then, two circular openings 70 and 71 are formed on the silicon oxide film 72 at the positions spaced from each other. The circular openings 70 and 71 are formed such that a straight line connecting the centers of the openings 70 and 71 is approximately parallel to the orientation flat showing nominal orientation <110> of the silicon wafer.

Thereafter, the resulting silicon wafer is isotropically etched with an alkali solution such as potassium hydroxide (KOH) solution. Thereby, the silicon wafer is etched from the circular openings 70 and 71 on the silicon oxide film 72, so that etch pits 74 and 75 each having a square pyramid shape with the circular opening 70 or 71 as the center are formed on the surface of the silicon wafer (FIG. 17(*a*)). These etch pits 74 and 75 are squares having four sides of orientation <110> on the surface of the silicon wafer.

Subsequently, a photomask 78 is prepared for obtaining a true orientation <110> of the silicon wafer. This photomask 78 is provided, as shown in FIG. 17(*b*), with a square window 76 and a rectangular window 77 arranged as follows to provide a mark line for mask alignment: The windows 76 and 77 are spaced from each other like the openings 70 and 71 and disposed in a parallel relation. The shorter sides of the windows 76 and 77 are smaller than the sides of the etch pits 74 and 75.

The photomask 78 is arranged and aligned on the silicon wafer having the etch pits 74 and 75 thereon. As shown in FIG. 17(*c*), the alignment is performed so that the sides of the etch pits 74 and 75 are parallel to the sides of the windows 76 and 77. This brings the mark line for the mask alignment directing the true orientation <110> of the silicon wafer indicated by reference numeral 80.

In this method, even if surfaces oriented in the orientation <110> are produced with respect to the circular openings 70 and 71 on the silicon oxide film 72 by isotropic etching using the alkali solution and thereby the photomask is aligned in the right position, this alignment is obtained only with respect to a positional alignment pattern, i.e., the circular openings 70 and 71. Such alignment is not always accurate with respect to a pattern for evaluating the plane orientation dependence or a pattern for an actual device in which plane orientations are required to be matched in consideration of potential deformation or warpage of silicon wafers which may vary every shot (depending upon silicon ingots). In other words, the photomask is aligned only in an indirect manner by this method.

The wafer obtained by the above-described process cannot be applied to a plane orientation evaluation pattern or an actual device. For, when a silicon wafer having plane (100) is etched in potassium hydroxide (KOH) solution, a surface thereof having plane (111) remains because dissolution rate is extremely slow in plane (111). Therefore, the etch pits formed on the silicon wafer have a V-shaped trench with an angle of about 55°. The etch pits cannot be applied to a trench-formation process in manufacture of the above-mentioned trench-type vertical power MOSFET, particularly.

In order to form on a silicon wafer a trench-shaped etch pit having vertical sidewalls, a special silicon wafer having a surface of orientation (110) is required to be used. It is difficult to apply such a special silicon wafer to a process flow established for a mainstream silicon wafer having plane (100).

Under such circumstances, there has been the demand for a technique for accurately and easily determining one or more plane orientations of a substrate and evaluating the dependence of arious properties of the substrate on the plane orientations by a single process.

SUMMARY OF THE INVENTION

The present invention provides a method for evaluating a plane orientation dependence of a semiconductor substrate comprising:

forming a hard mask on a semiconductor substrate having plane orientation (100);

anisotropically etching the semiconductor substrate with use of the hard mask as a mask to obtain a surface oriented in a specific crystal orientation; and evaluating a plane orientation dependence of properties of the semiconductor substrate by use of at least a portion of the surface oriented in the specific crystal orientation.

Further, the present invention provides a semiconductor device produced using a surface of a semiconductor substrate oriented in a specific crystal orientation as a crystallographic reference orientation, said surface being obtained by anisotropically etching a semiconductor substrate having plane orientation (100).

Moreover, the present invention provides a method for aligning a photomask comprising:

forming a hard mask on a semiconductor substrate having plane orientation (100);

anisotropically etching the semiconductor substrate with use of the hard mask as a mask to obtain a pillar or trench having a surface oriented in a specific crystal orientation; and aligning a photomask using the obtained surface of the pillar or trench as a reference pattern.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 4(*a*) to 4(*b*) are schematic sectional views of an essential part of a semiconductor device showing an embodiment of a method for evaluating a plane orientation according to the present invention wherein FIG. 4(*b*) is a sectional view cut along X1–X1' line in FIG. 4(*a*);

FIGS. 14(a) and 14(b) are schematic sectional views of an essential part of a semiconductor device showing an embodiment of a method for evaluating a plane orientation according to the present invention wherein FIG. 14(b) is a sectional view cut along X6–X6' line in FIG. 14(a);

DESCRIPTION OF THE PREFERRED EMBODIMENT

Figure 1:
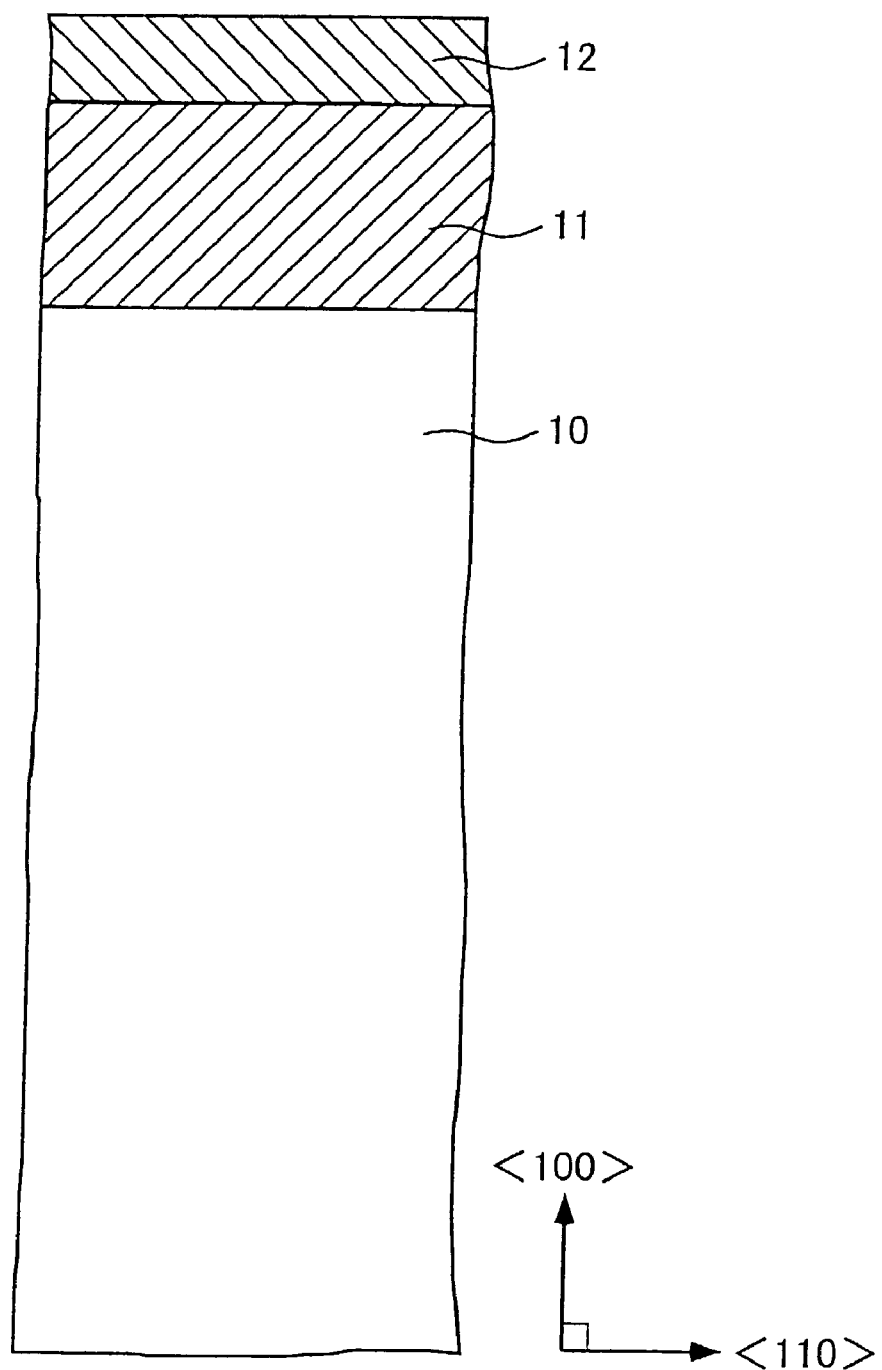
FIG. 1 is a schematic sectional view of an essential part of a semiconductor device showing an embodiment of a method for evaluating a plane orientation according to the present invention.
Figure 2:
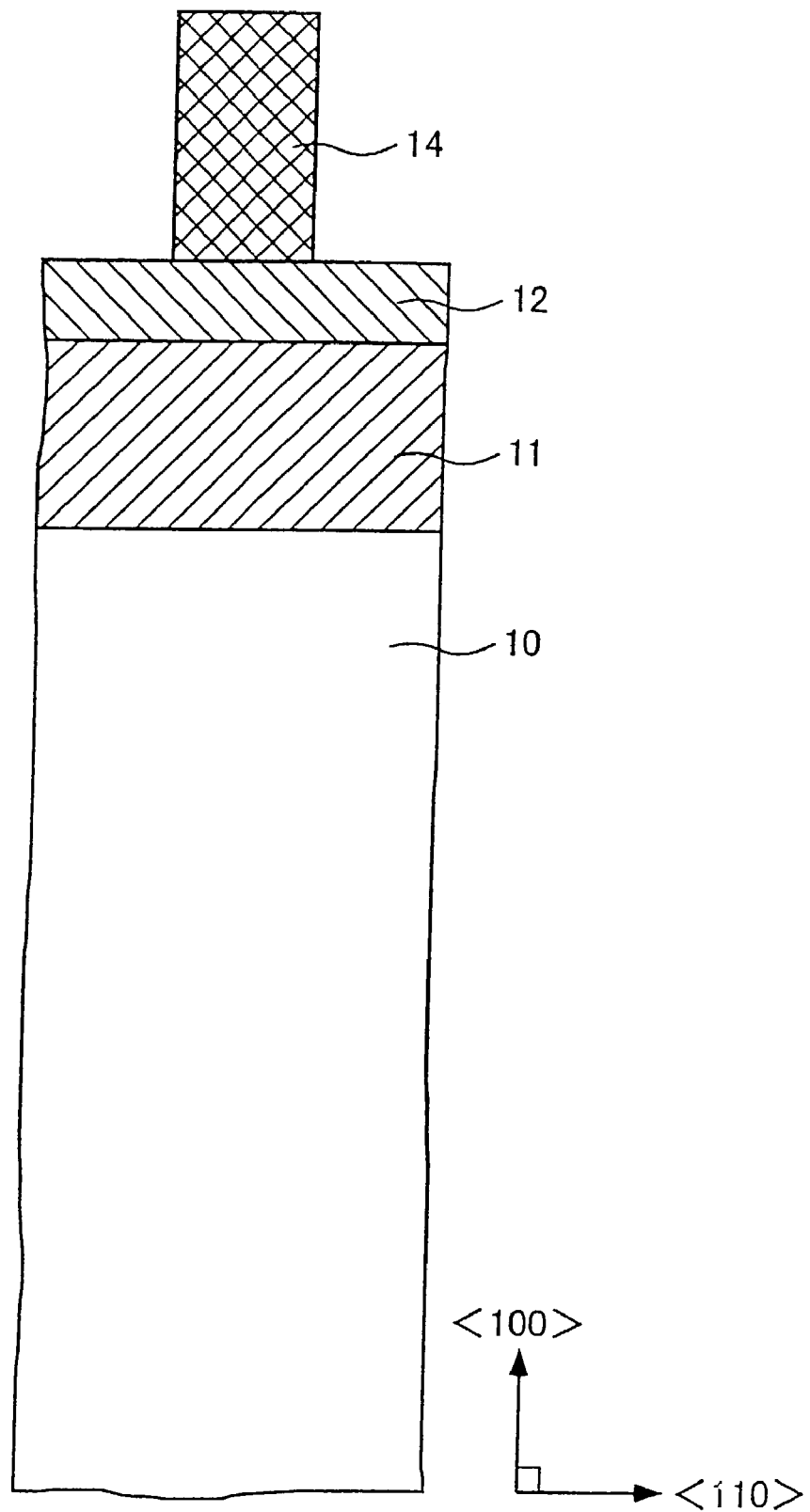
FIG. 2 is a schematic sectional view of an essential part of a semiconductor device showing an embodiment of a method for evaluating a plane orientation according to the present invention.

In the present invention, firstly, a hard mask is formed on a semiconductor substrate having plane orientation (100).

The semiconductor substrate used in the present invention may preferably have a diamond crystal structure. This is because it is experimentally confirmed that the later-mentioned effect can be obtained with a silicon material having the diamond crystal structure. This effect can also be obtained by a material having the same diamond crystal structure such as germanium, diamond or the like in addition to silicon.

The semiconductor substrate may have an impurity diffusion layer, or may have an epitaxially grown silicon film. Further, it may have an epitaxially grown silicon film on a surface of SOI substrate or an epitaxially grown silicon film on a insulating film as a SOI substrate. Also the semiconductor substrate may have an orientation flat or a notch.

The shape of the hard mask may be a circle, a ellipse or a symmetric polygon, preferably a circle or a symmetric polygon. For example, the symmetric polygon is an octagon, square, rectangular or the like. The hard mask is several nm to several μm in size (diameter, length of a side, length of a diagonal line, etc.). When the hard mask has such a shape, the next etching can uniformly and effectively be executed. Also, it is possible to use a hard mask which has a window (several nm to several μm in size) of a circle or symmetric polygon as mentioned above.

The hard mask may be formed of a laminated film of a silicon oxide film and an amorphous silicon film, a single silicon oxide film or a single amorphous silicon film. Any material that is not etched by the reactive ion etching of the semiconductor substrate (e.g., silicon substrate) or has an etching rate slower than that of the semiconductor substrate can be used for the hard mask. Examples of such materials include a single silicon nitride film or a laminate film including a silicon nitride film.

Then, the semiconductor substrate is anisotropically etched using the hard mask as a mask to obtain a surface oriented in a specific crystal orientation.

A preferable etching amount of the anisotropic etching is for obtaining a depth of at least several times the size of the hard mask when a semiconductor (e.g., silicon) pillar or trench is formed. Such etching amount ensures that plane (100) appears at a lower section of the pillar or trench so that the lower section forms a substantial prism (referred to as a prism for simplicity hereinafter). Accordingly, the prism pillar or trench having plane (100) on its surface can assuredly be utilized for the evaluation of the plane orientation.

For example, a hard mask of a circular dot pattern is formed on a silicon substrate having plane (100), and then, a columnar silicon pillar is formed by reactive ion etching. The silicon pillar has a cylindrical shape according to the shape of the hard mask in the case where the etching amount is relatively small. On the other hand, as the etching amount increases, plane (100) appears at the lower section of the pillar, which forms a prism.

Therefore, the surface oriented in the specific crystal orientation is preferably a surface having plane (100). This is because if the surface oriented in the specific crystal orientation has plane (100), e.g., if the prism pillar in which plane (100) appears on its surface is used, the corner of the prism corresponds to plane (110). This is effective in that the evaluation of the plane orientation dependence of the properties of the semiconductor substrate can be simultaneously and easily observed on the surface having plane (100) and the surface having plane (110).

However, other plane orientation may be provided by setting etching methods and conditions.

Next, the plane orientation dependence is evaluated by use of at least a portion of the surface oriented in the specific crystal orientation.

Here, the "plane orientation dependence" means that the physical properties of the semiconductor substrate vary depending upon the plane orientation. For example, a rate of thermal oxidation, a rate of etching, electron mobility and the like are defined by the plane orientation and vary depending upon the plane orientation.

The evaluation of the surface orientation dependence may be performed, for example, by forming a thermal oxide film on the obtained prism-shaped pillar in which a surface having plane (100) appears and observing the thermal oxide film. Thus, thermal oxide films formed on the surface having plane (100) and the surface having plane (110) are observed simultaneously and easily, and thereby the plane orientation dependence is evaluated with respect to a thermal oxidation property.

According to the evaluation method of the present invention, it is also possible to carry out wafer-to-wafer evaluation of the dependence of properties of the substrate upon the plane orientation which is affected by physical factors such as fluctuation or deviations in the impurity content, crystal defect density and the like, deformation, warpage and the like which may differ wafer by wafer.

A semiconductor device of the present invention may be one produced by using at least a portion of a surface oriented in a specific crystal orientation as a specific crystal reference orientation or a crystallographic reference orientation, more particularly, by using the prism pillar or trench in which the surface having plane (100) appears as a reference for photomask alignment to precisely determine a crystallographic reference orientation of the wafer.

When a hard mask of a circular hole pattern is formed on the semiconductor substrate having plane (100), followed by performing the reactive ion etching, a cylindrical trench is formed. As the etching amount increases, the surface oriented in the specific crystal orientation appears at a lower section of the trench, whereby it becomes in a prism form. The cylindrical trench area at an upper section of the trench is removed by, for example, a known chemical mechanical polishing (CMP), and thereby a trench shape easy to be adapted to a device and having plane orientations matched to one another can be obtained in self-alignment.

The prism-shaped silicon pillar or trench having the surface of plane (100) may be also used for the semiconductor device.

Also, when the surface of the semiconductor substrate oriented in a specific crystal orientation is a surface of a pillar or a trench formed in the semiconductor substrate, the pillar or trench may be used for a part of the semiconductor device, for example active region (a channel, S/D regions, impurity diffusion layer, etc.,), trench device isolation region and the like.

In another respect of the present invention, it is provide a method for aligning a photomask. For, example, the method comprises the steps of: forming a hard mask on a semiconductor substrate having plane orientation (100); anisotropically etching the semiconductor substrate with use of the hard mask as a mask to obtain a pillar or trench having a surface oriented in a specific crystal orientation; and aligning a photomask using the obtained surface of the pillar or trench as a reference pattern.

For performing the above method, two pillars or trenches are obtained in the form of prisms each having a surface oriented in a specific crystal orientation by anisotropic etching. The two pillars or trenches is separate from each other.

The photomask using of the present invention has a pattern provided with two marks at a spaced interval. The two marks are prefarably in a parallel relation and each having two pairs of parallel sides. The photomask is aligned by putting the sides of the marks of the photomask in parallel with the sides of the pillars or trenches. Thereby a line connecting the centers of the two marks of the photomask or a line parallel to a side of the marks indicates crystallographic reference orientation, i.e., a specific crystal orientation accurately.

Explained hereinbelow with reference to the attached drawings are preferred embodiments of the method for evaluating the plane orientation dependence and the semiconductor device manufactured by the method according to the present invention.

Figure 15A:
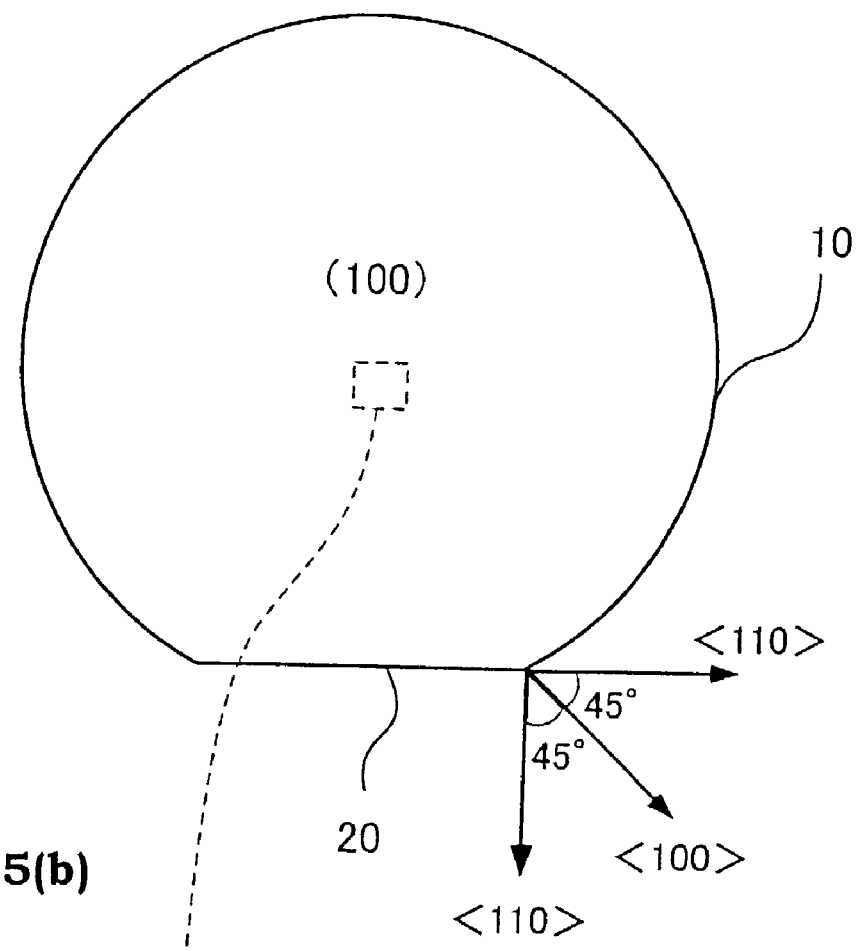
FIG. 15(i a) to 15(b) are plan views of a semiconductor substrate used for a method for evaluating a plane orientation of a semiconductor substrate according to the present invention.
Figure 15B:
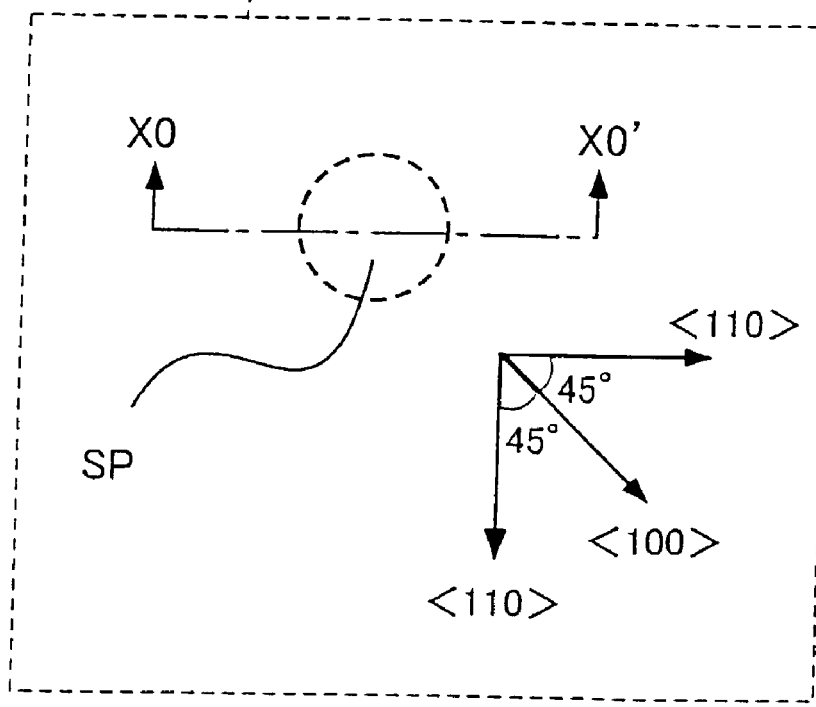
Figure 16:
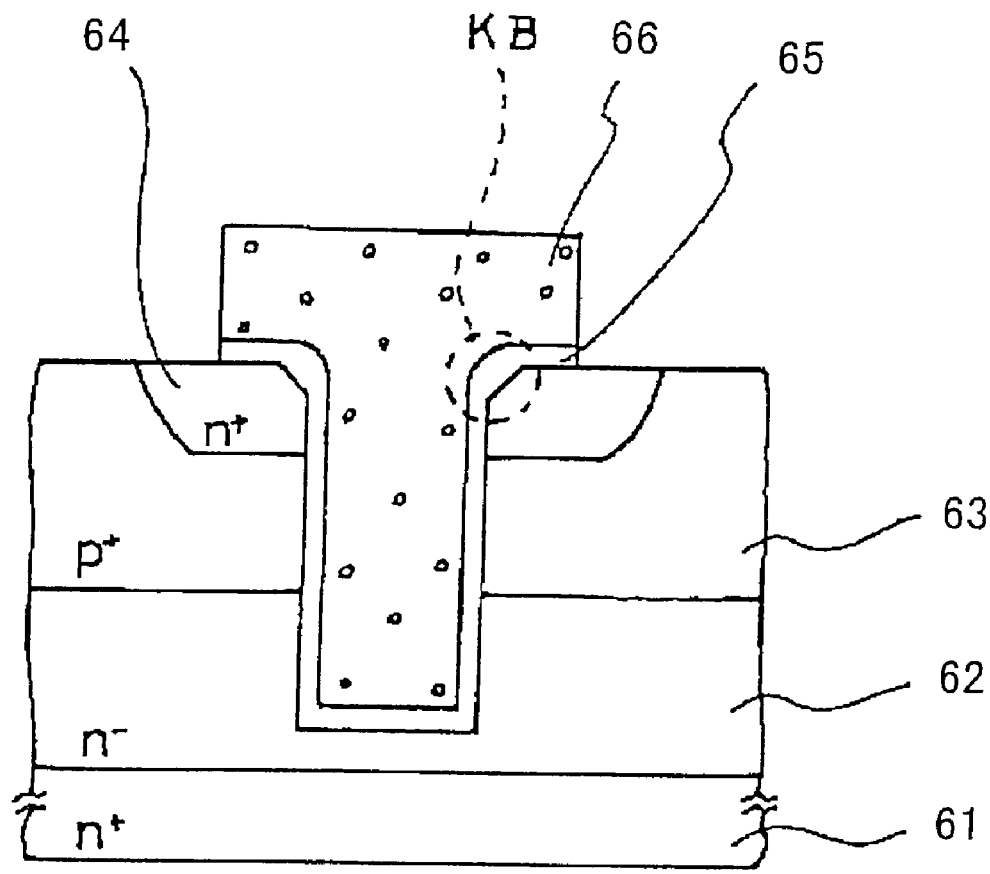
FIG. 16 is a sectional view showing a structure of a conventional semiconductor device.
Figure 16:
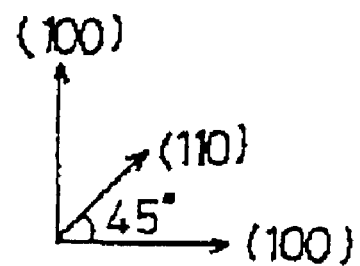
Figure 17A:
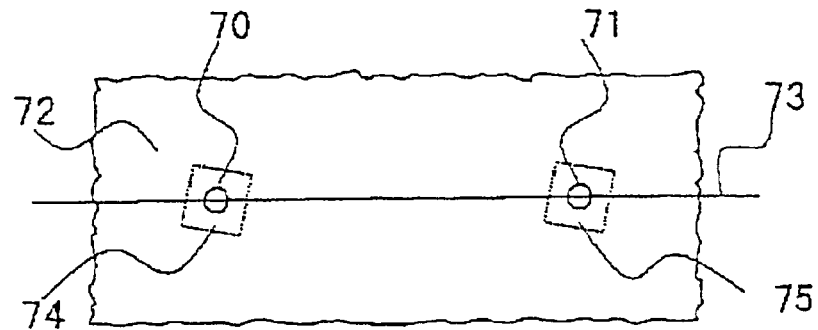
FIG. 17(a) to 17(c) are plan views for explaining a conventional method for aligning a silicon wafer with a photomask.
Figure 17B:
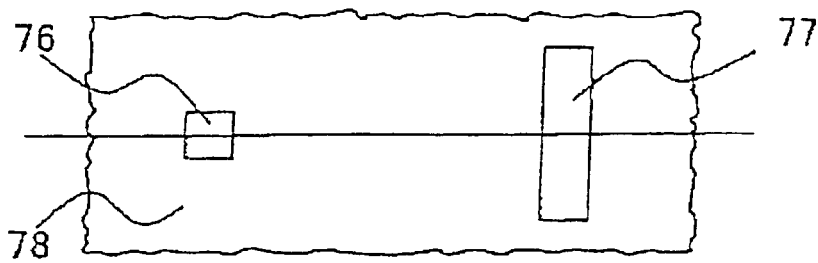
Figure 17C:
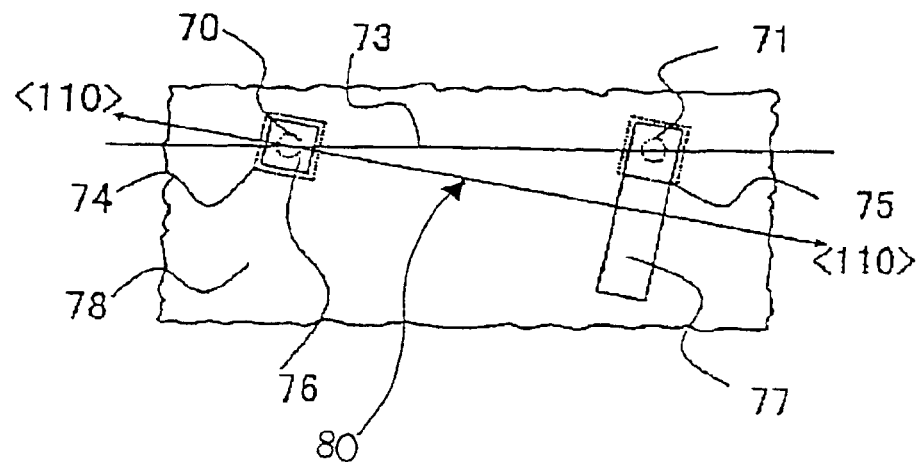

FIG. 15(a) shows a plan view of a silicon substrate 10 of a single conductive type, and FIG. 15(b) shows an area SP (Silicon Pillar) in the silicon substrate 10 where a silicon pillar or a silicon trench having a surface oriented in a specific crystal orientation is formed. Each sectional view in figures showing a process of the embodiments of the present invention represents a section in direction X0–X0' in FIG. 15(b) unless otherwise indicated.

EXAMPLE 1

A specific manufacturing process for self-alignedly obtaining a silicon pillar having a surface oriented in a specific crystal orientation without deviation will be explained with reference to FIGS. 1 to 5.

Firstly, a thermal oxide film is formed as a pad oxide film with a thickness of about 5 to 20 nm, as need arises, on the surface of the silicon substrate 10 having the surface of plane (100). Thereafter, a silicon oxide film 11 is deposited with a thickness of about 100 to 2000 nm. Subsequently, an amorphous silicon film 12 is deposited to form a hard mask (FIG. 1).

Figure 3:
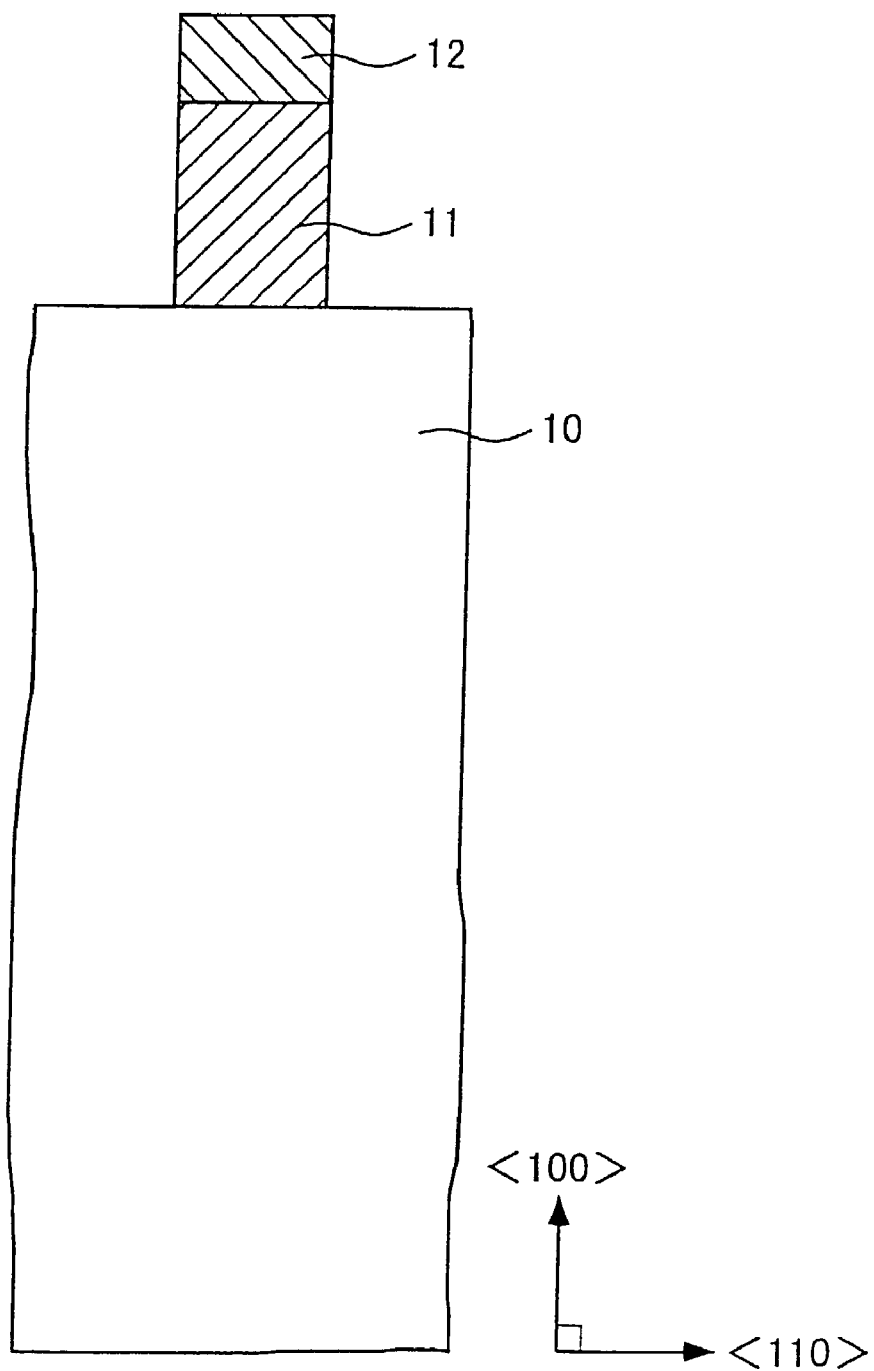
FIG. 3 is a schematic sectional view of an essential part of a semiconductor device showing an embodiment of a method for evaluating a plane orientation according to the present invention.

Subsequently, the amorphous silicon film 12 and the silicon oxide film 11 are successively etched by reactive ion etching of a known photolithography technique using a circularly patterned resist pattern (dot pattern) 14 as a mask (FIG. 2), whereby the hard mask is circularly patterned (FIG. 3).

Although the resist pattern 14 is desirably a circle in order to expose the surface of plane (100) with a shallower etching depth upon silicon etching, it may be an ellipse shape, symmetric polygon (for example, octagon, square or rectangular) or the like.

Thereafter, the resist pattern 14 is removed by ashing, and then, the resulting substrate is subjected to a post-treatment with hydrogen fluoride (HF) solution. Next, the silicon substrate 10 is etched by the reactive ion etching using the circularly patterned hard mask as a mask, i.e., using the silicon oxide film 11 and the amorphous silicon film 12 as a mask (FIG. 4(a)).

Examples of gases usable for anisotropically etching the silicon substrate 10 include chlorine gas ($Cl_2$), hydrogen bromide gas (HBr), oxygen gas ($O_2$) or mixture gases of these.

In case where the depth of the silicon substrate 10 etched with the anisotropic etching is not so deep with respect to the size of the mask, the formed silicon pillar has a shape along the shape of the mask. Specifically, the formed silicon pillar becomes a circular cylinder as shown in FIG. 4(b) (FIG. 4(b) shows a section cut along the X1–X1' line in FIG. 4(a)) when the circular mask is used.

Figure 5A:
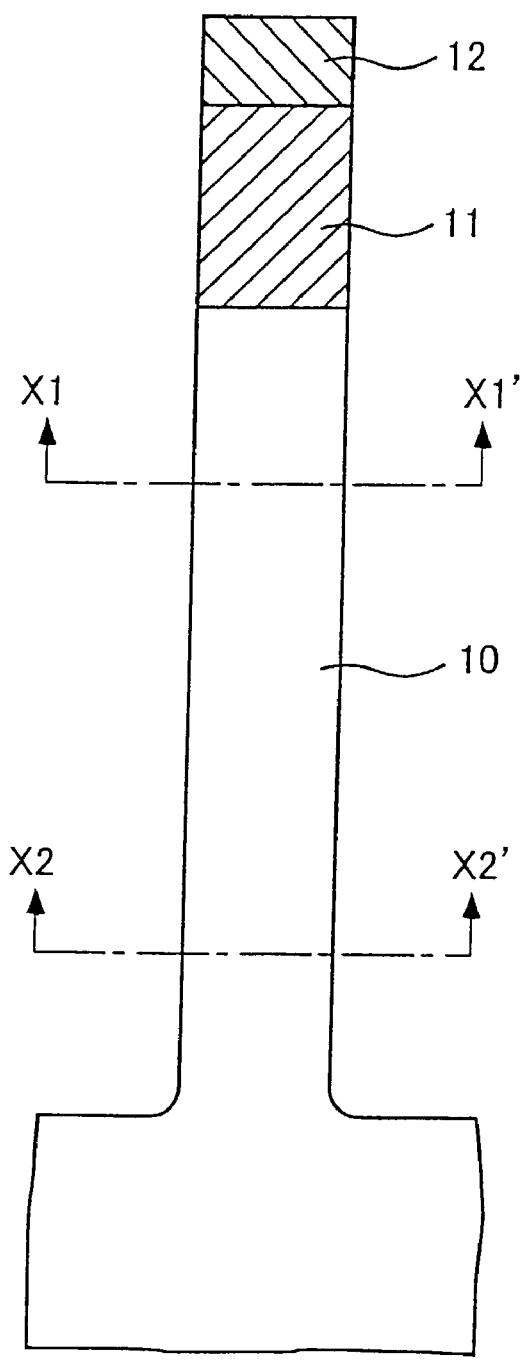
FIGS. 5(*a*) to 5(*c*) are schematic sectional views of an essential part of a semiconductor device showing an embodiment of a method for evaluating a plane orientation according to the present invention wherein FIG. 5(*b*) is a view cut along X1–X1' line in FIG. 5(*a*) and FIG. 5(*c*) is a view cut along X2–X2' line in FIG. 5(*a*)
Figure 5B:
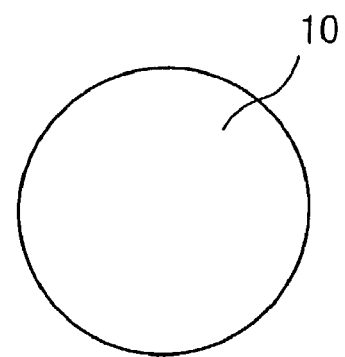
Figure 5C:
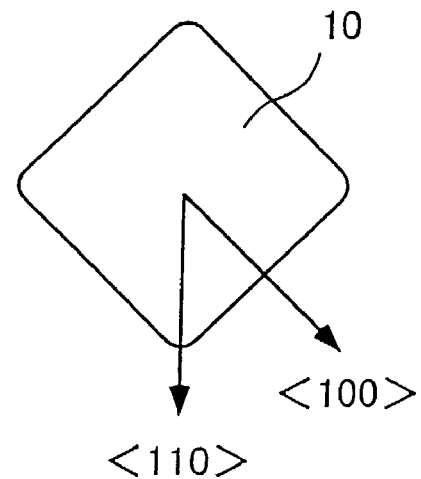

However, in case where the silicon substrate 10 is anisotropically etched sufficiently deeply with respect to the size of the mask (FIG. 5(a)), to be specific, in case where the resist 14 is a circular pattern having a diameter of 200 nm and the anisotropic etching is carried out to a depth of approximately 2000 nm, a prism-like shape appears at the lower section of the silicon pillar as shown in FIG. 5(c) (FIG. 5(c) shows a section cut along the X2–X2' line in FIG. 5(a)) even though the hard mask of the circular pattern is used.

The reason is considered to be as follows. When the silicon substrate is etched by reactive ion etching, a reactive Cl radical combines with a silicon atom with the help of ion impact, thereby producing silicon chloride ($SiCl_4$) having a low vapor pressure. Accordingly, the above-mentioned reactive etching is accelerated on the surface of plane (100), which has the greatest atomic density in the process of etching.

Each surface of the prism silicon pillar is oriented in plane (100), while each corner of the prism corresponds to the plane (110). Consequently, a silicon pillar having surfaces oriented in the specific crystal orientations is formed self-alignedly without deviation in the orientations by the above process.

EXAMPLE 2

Figure 6:
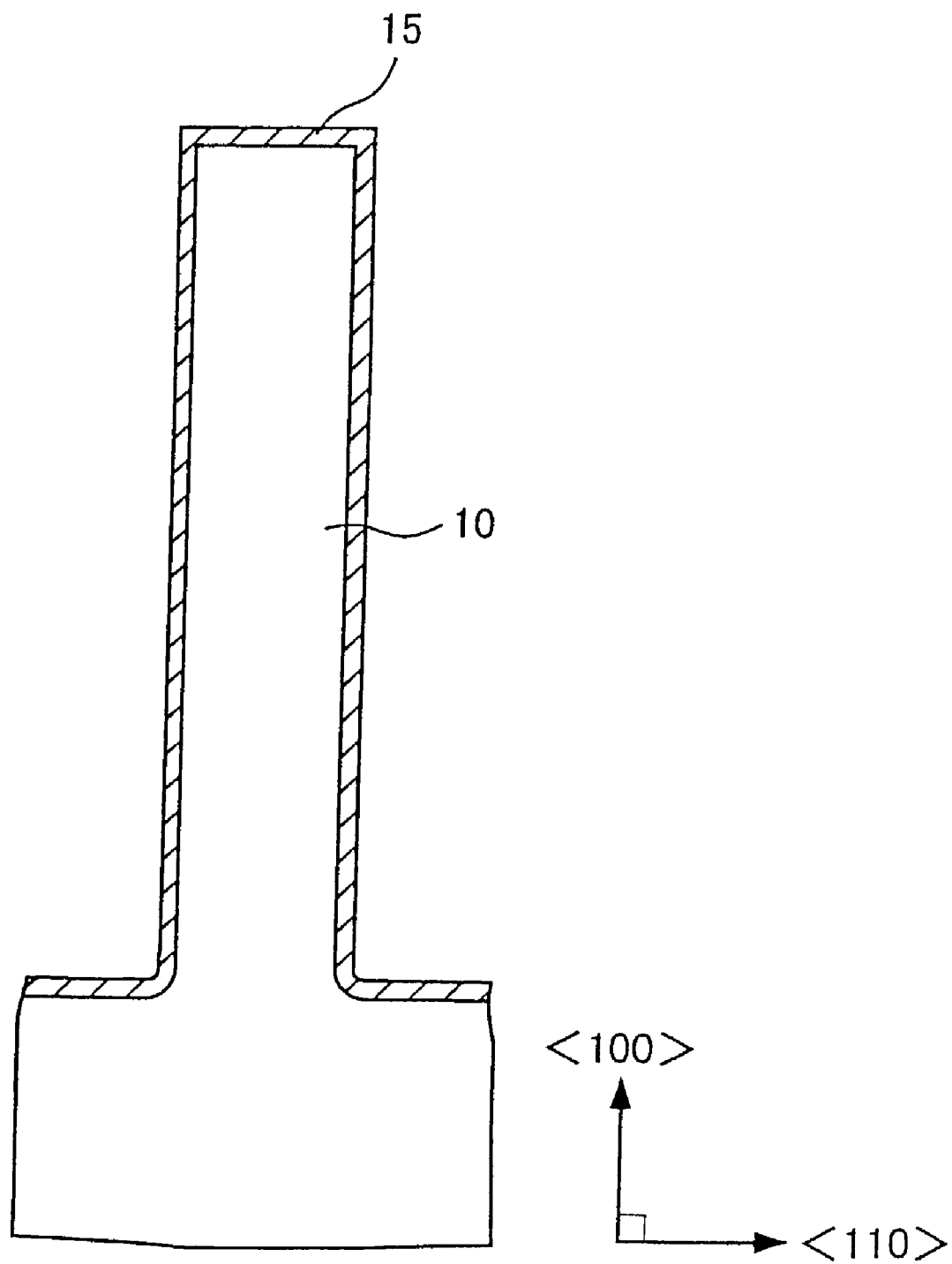
FIG. 6 is a schematic sectional view of an essential part of a semiconductor device showing another embodiment of a method for evaluating a plane orientation according to the present invention.
Figure 7:
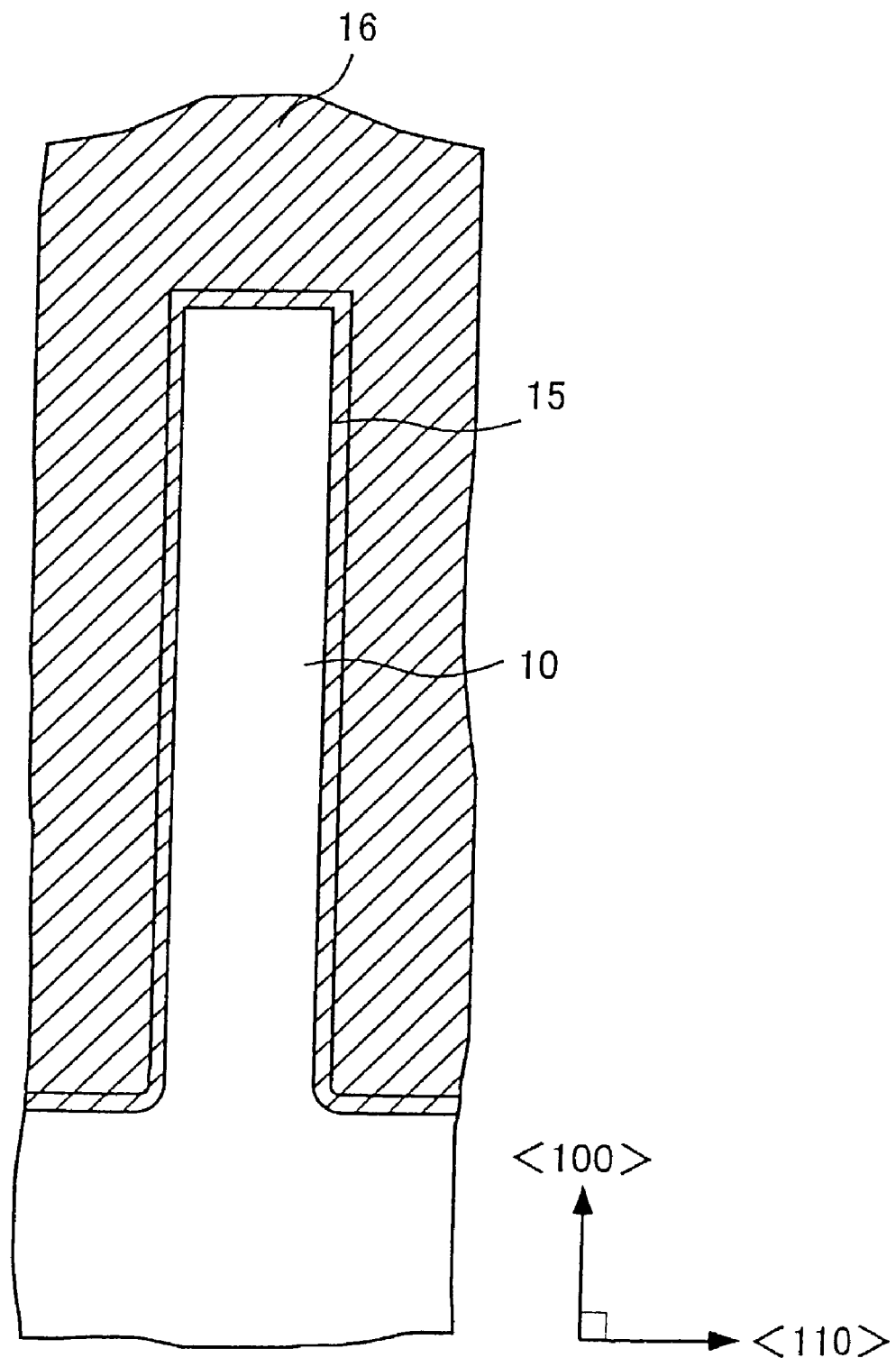
FIG. 7 is a schematic sectional view of an essential part of a semiconductor device showing another embodiment of a method for evaluating a plane orientation according to the present invention.
Figure 8A:
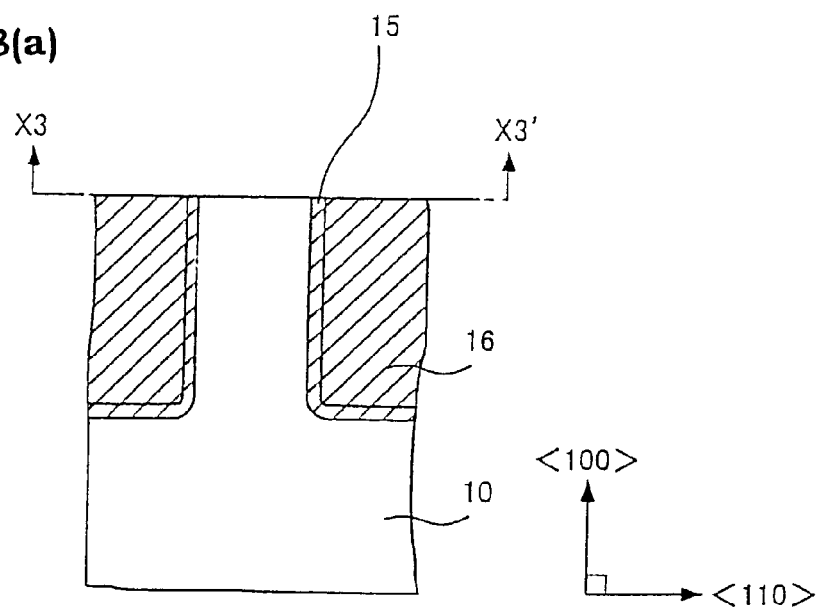
FIGS. 8(*a*) to 8(*c*) are schematic sectional views of an essential part of a semiconductor device showing another embodiment of a method for evaluating a plane orientation according to the present invention wherein FIG. 8(*b*) is a sectional view cut along X3–X3' line in FIG. 8(*a*) and FIG. 8(*c*) is a sectional view cut along X2–X2' line in FIG. 8(*a*)

Next, explained with reference to FIGS. 6 to 8 is a specific embodiment wherein the silicon pillar having a surface oriented in a specific crystal orientation is used for evaluating the plane orientation dependence upon forming a thermal oxide film.

A thermal oxide film 15 is formed (FIG. 6) on the prism silicon pillar, according to need, after removing the silicon oxide film 11 and the amorphous silicon film 12 (this embodiment shows the case where they are removed). Then, a silicon oxide film 16 is embedded at the space between pillars (FIG. 7). Thereafter, the resulting semiconductor substrate is polished from the upper surface thereof by a known chemical mechanical polishing technique (CMP), and thereby a section of the thermal oxide film 15 formed on the sidewalls of the pillars is exposed (FIG. 8(a)).

The side and corner of a section of the prism silicon pillar are observed from the top thereof with, for example, a scanning electron microscope (SEM). By this observation, the silicon oxide film formed on the surface of plane (100) and the surface of plane (110) can easily and simultaneously be observed (FIG. 8(b)).

Since one prism silicon pillar has at least four sides and corners, many samples can be obtained in a short period for evaluating the plane orientation dependence with respect to thermal oxidation of the silicon oxide film using a statistical technique. Therefore, highly reliable measuring results can be obtained.

Figure 8B:
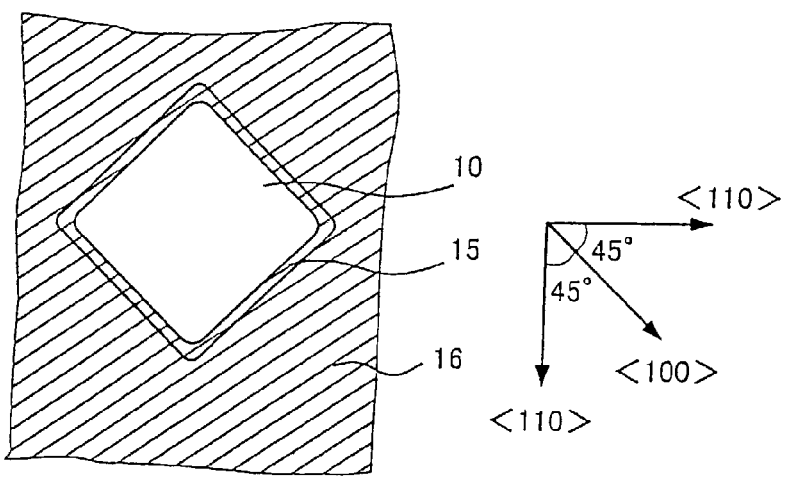
Figure 8C:
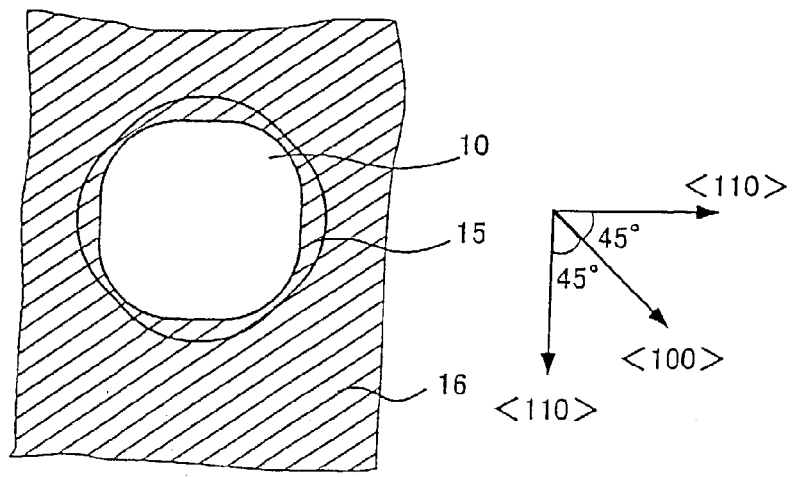

The plane orientation dependence with respect to the thermal oxidation may be evaluated by observing the silicon pillar in a state of a substantial prism defined by surfaces oriented in plane (100) as shown in FIG. 8(b) or by observing a columnar silicon pillar in a state of having a surface oriented in plane (100) on a portion of a side face thereof as shown in FIG. 8(c).

EXAMPLE 3

The silicon pillar having the surface oriented in the specific crystal orientation by reactive ion etching may be used for a reference of a photomask alignment to accurately determine a crystallographic reference orientation of the silicon wafer, like the plane orientation reference pattern formed with the conventional isotropic etching using an alkali solution.

Figure 9A:
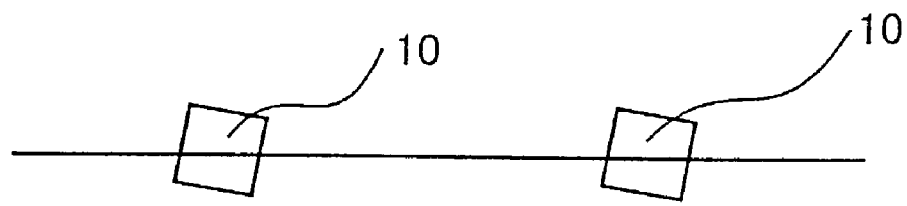
FIG. 9(*a*) to 9(*c*) are plan views for explaining a method for aligning a silicon wafer and a photomask according to the present invention.
Figure 9B:
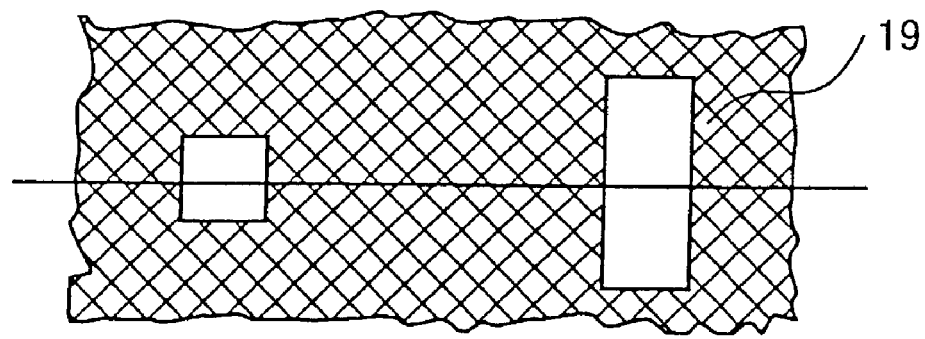
Figure 9C:
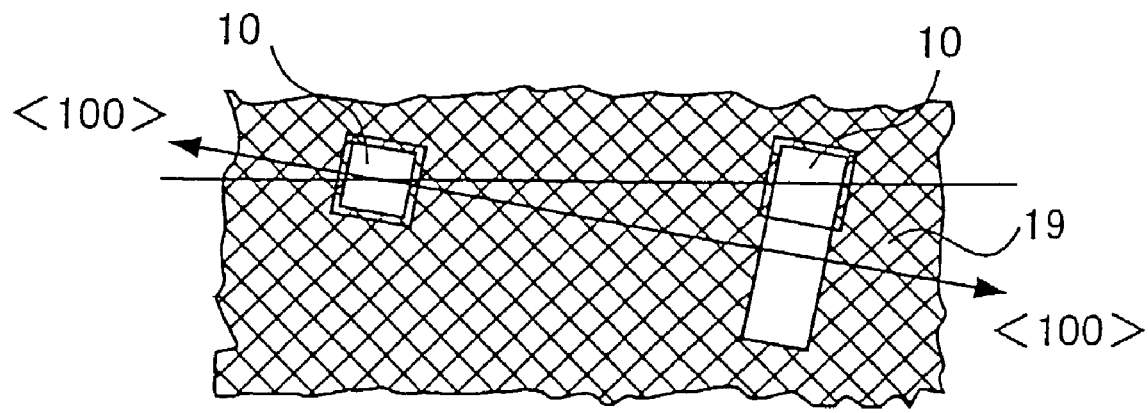

Explained hereinbelow with reference to FIGS. 9(a) to 9(c) is one embodiment wherein a silicon pillar is used for a specific plane orientation reference pattern on the silicon substrate.

At first, two silicon pillars 10 each having a surface oriented in plane (100) are formed in such a manner that they are spaced from each other. The upper section of each pillar is removed by a CMP technique, as required, so that side faces of the silicon pillars 10 oriented in plane (100) can be confirmed from the top surface (FIG. 9(a)).

Subsequently, a resist pattern 19 having a square window and a rectangle window which are spaced from each other like the two silicon pillars is aligned and arranged on the silicon substrate in such a manner that each side of the silicon pillars 10 is parallel to each side of the windows (FIG. 9(b)). Thereby, the position alignment mark line of the photomask directs true direction <100> of the silicon wafer (FIG. 9(c)).

When the silicon pillars are formed by reactive ion etching for the plane orientation reference pattern, a element isolation region formed by shallow trench isolation method is simultaneously formed on the silicon wafer without performing isotropic etching with alkali solution, thereby reducing the number of production steps.

EXAMPLE 4

A silicon trench having a surface oriented in a specific crystal orientation may be formed. A specific manufacturing example of the silicon trench will be explained with reference to FIGS. 10 to 14.

Firstly, a thermal oxide film (not shown) is formed as a pad oxide film with a thickness of about 11 nm, as need arises, on the surface of the silicon substrate 10 having plane (100). Thereafter, a silicon oxide film 11 is deposited, and then, an amorphous silicon film 12 is deposited. The processes so far are the same as those of EXAMPLE 1 (FIGS. 1 to 5).

Figure 10:
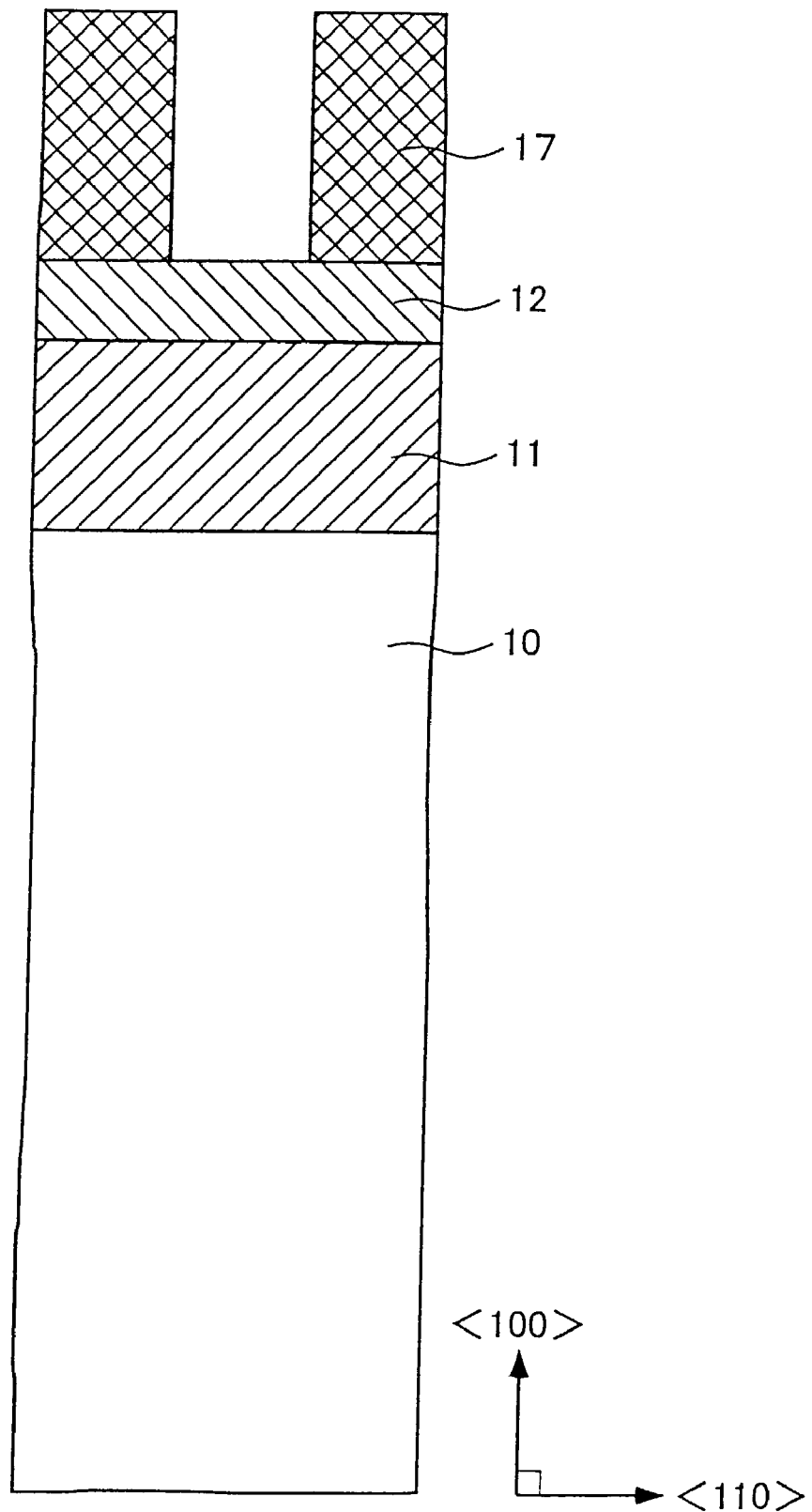
FIG. 10 is a schematic sectional view of an essential part of a semiconductor device showing still another embodiment of a method for evaluating a plane orientation according to the present invention.
Figure 11:
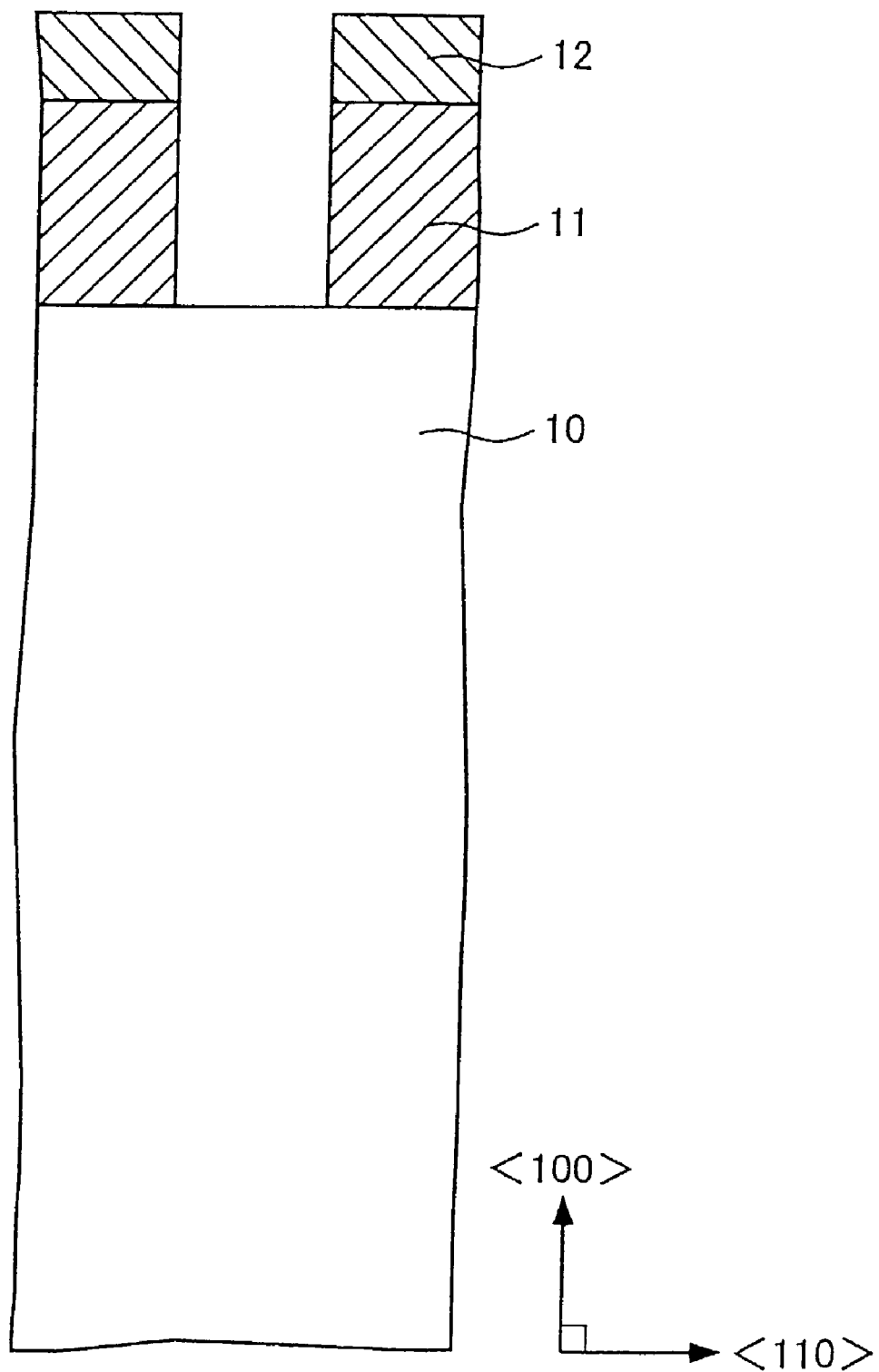
FIG. 11 is a schematic sectional view of an essential part of a semiconductor device showing a still another embodiment of a method for evaluating a plane orientation according to the present invention.

Subsequently, the hard mask is etched by reactive ion etching, in the same manner as in the previous example, with a resist pattern (hole pattern) 14 having a circular opening used for a mask with respect to the silicon substrate 10 (FIG. 10). Thereafter, the resist pattern 17 is ashed and the resulting substrate is subjected to the post-treatment with fluoride hydrogen (HF) solution (FIG. 11). The anisotropic etching is performed so that the depth of the silicon substrate 10 is sufficiently large with respect to the size (hole) of the mask. Thereby a silicon trench having the surface oriented in the specific crystal orientation is formed at a lower section of the pillar (FIG. 12(a)).

Figure 12A:
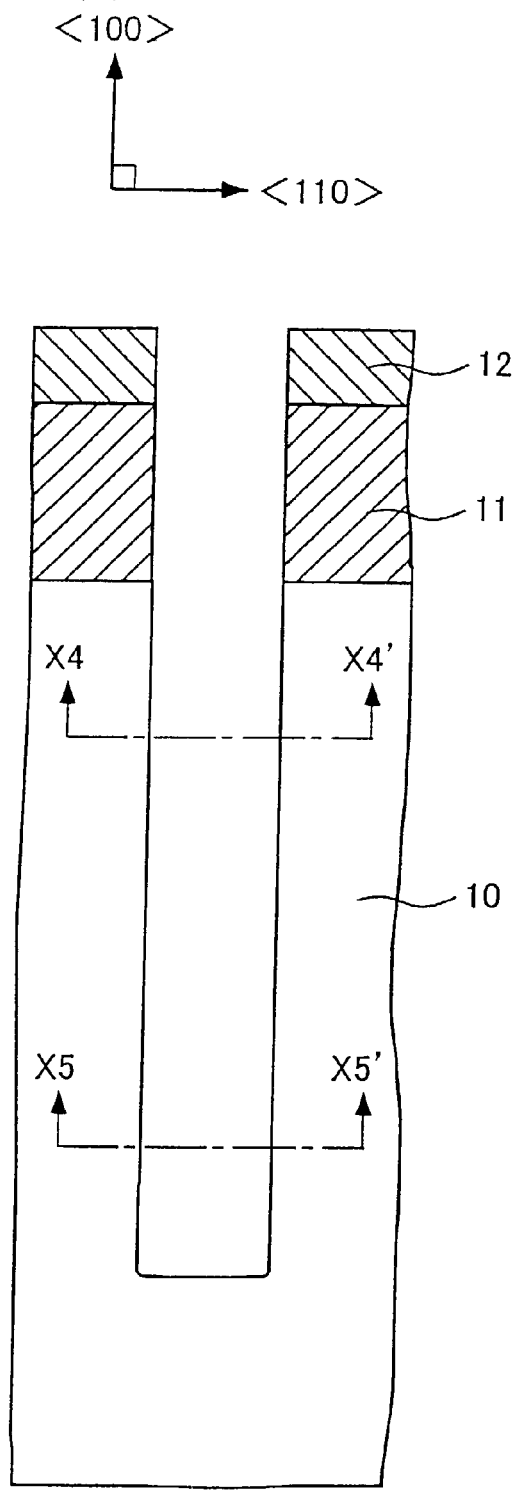
FIGS. 12(*a*) to 12(*d*) are schematic sectional views of an essential part of a semiconductor device showing an embodiment of a method for evaluating a plane orientation according to the present invention wherein FIG. 12(*b*) is a sectional view cut along X4–X4' line in FIG. 12(*a*), and FIGS. 12(*c*) and 12(*d*) are sectional views cut along X5–X5' line in FIG. 12(*a*)
Figure 12B:
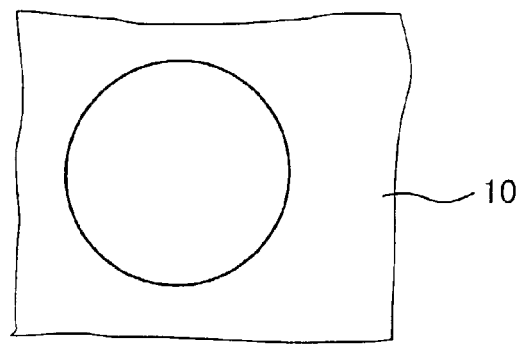
Figure 12C:
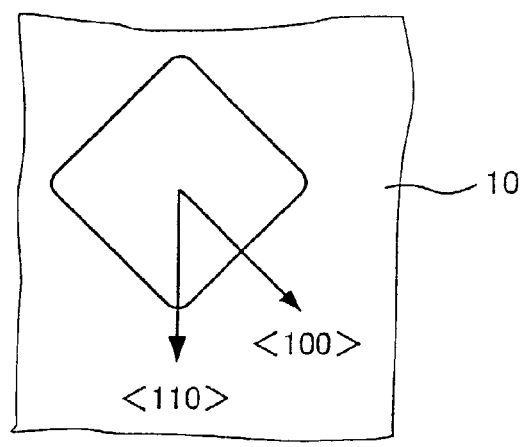
Figure 12D:
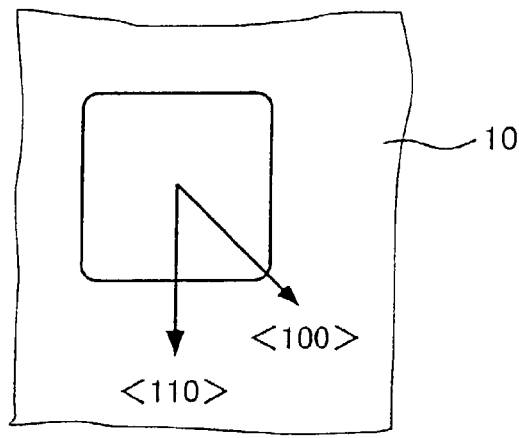

FIG. 12(b) shows a sectional view taken along X4–X4' line in FIG. 12(a), and FIGS. 12(c) and (d) show sectional views taken along X5–X5' line in FIG. 12(a). FIG. 12(c) shows the case where the oriented surface is of plane (100), while FIG. 12(d) shows the case where the oriented surface is of plane (110).

In case where the etching rate by reactive ion etching on the surface having plane (100) is faster than that on the surface having plane (110), plane (100) appears as the etching proceeds.

Figure 13:
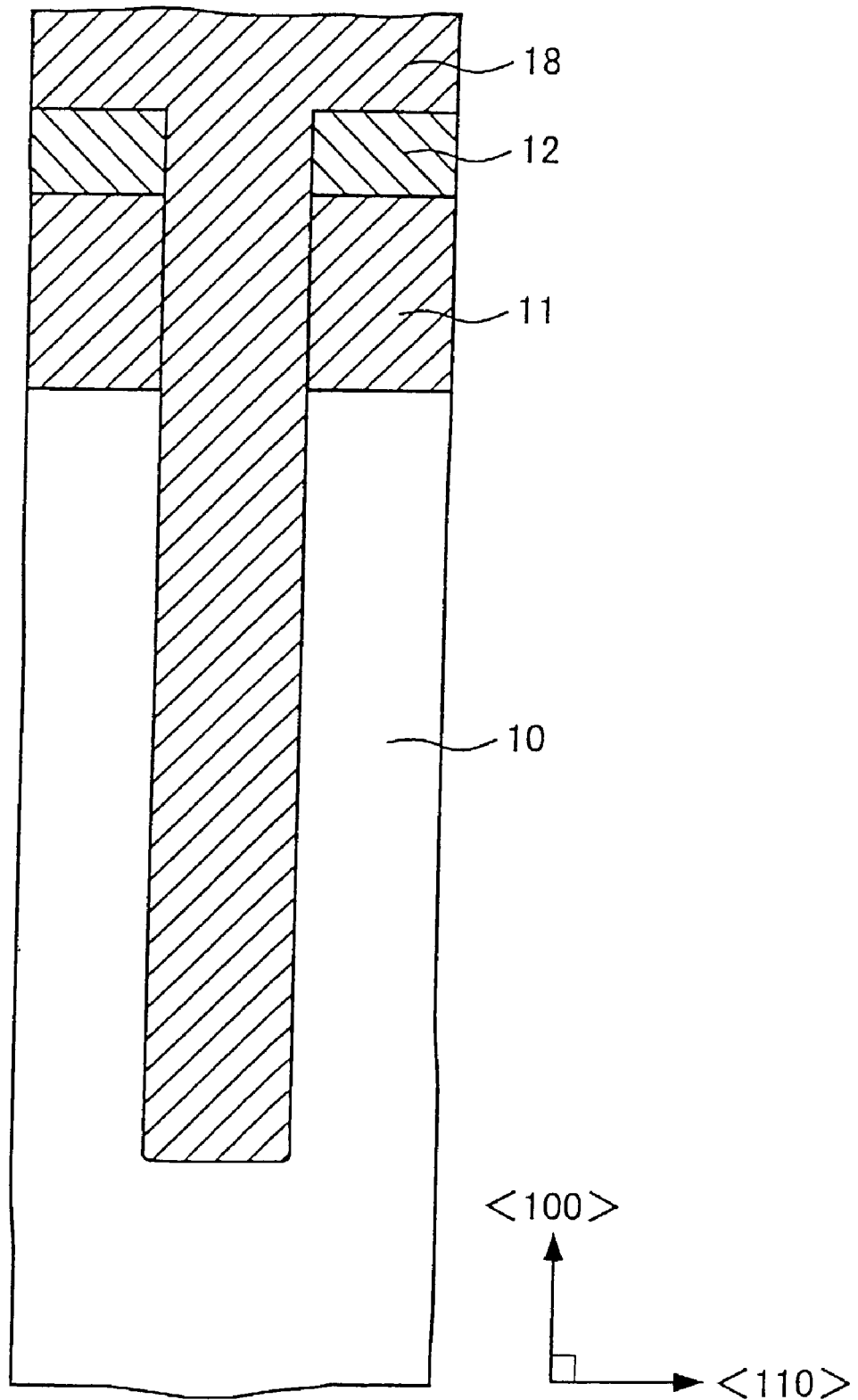
FIG. 13 is a schematic sectional view of an essential part of a semiconductor device showing still another embodiment of a method for evaluating a plane orientation according

A silicon oxide film 18, for example, is deposited a plurality of times as required to embed the silicon trench. Then, the silicon oxide film 18 is etched back according to need for planarization (FIG. 13). Thereafter, an upper circular trench area is removed by a CMP technique, and further, the silicon oxide film 16 is selectively removed. Accordingly, a prism silicon trench having matched plane orientations can be self-alignedly realized (FIG. 14(a)).

Figure 14A:
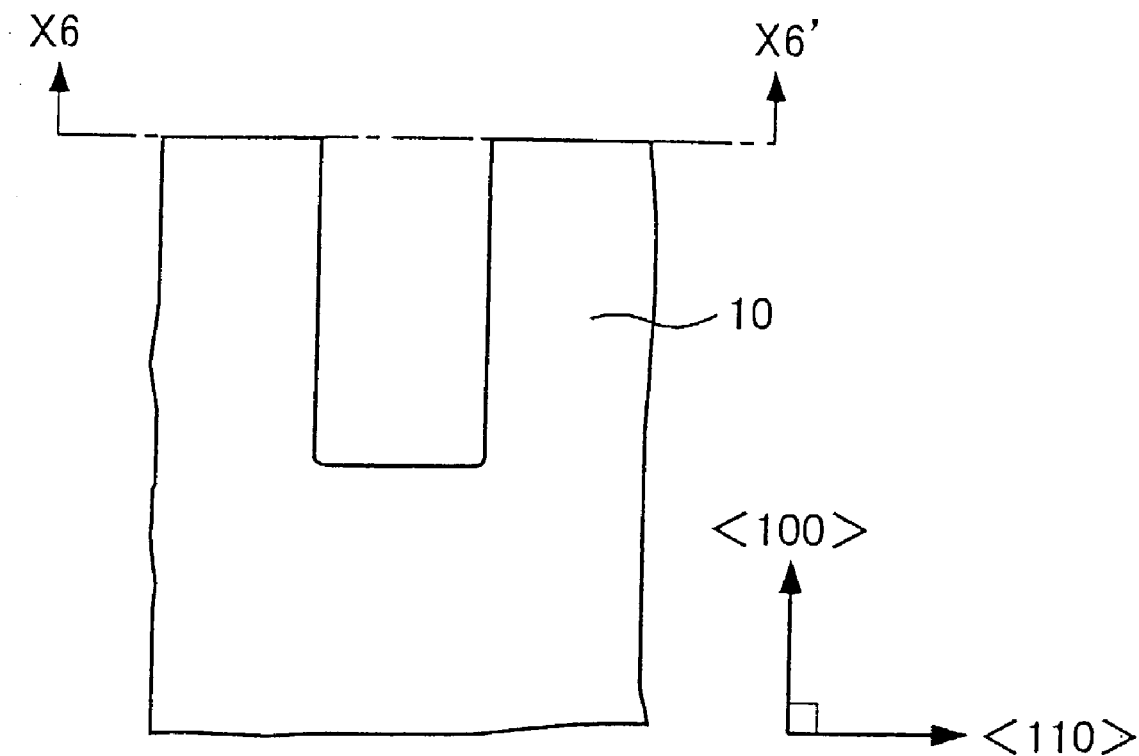
Figure 14B:
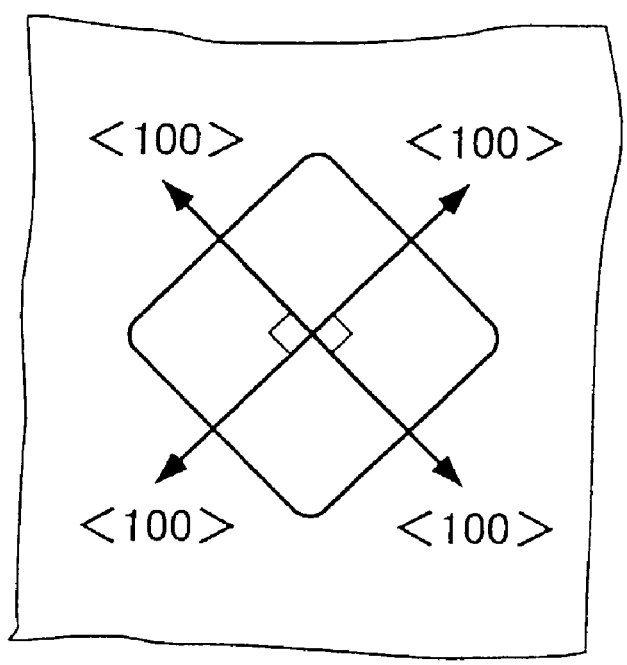

In case where the plane orientation in which the side surface of the prism silicon trench is oriented is plane (100) (FIG. 14(b)), the bottom surface of the trench formed with respect to the silicon substrate having a surface of plane (100) is also of plane (100). This results in all inner surfaces of the trench being of plane (100), which means all the inner surfaces of the trench are self-alignedly matched with each other to plane (100) without need to perform a special positional alignment.

If the above-mentioned technique is applied to a trench-type vertical power MOSFET or memory cells disclosed in Japanese Patent No. 2877462, for example, gate oxide films formed in the silicon trench have a uniform thickness with their plane orientations being matched to each other. Thereby a device with high performance in which the occurrence of the area with a reduced dielectric voltage is avoided can accurately and easily be manufactured without performing a complicated positional alignment.

Further, the use of plane (100) in which the oxidation rate is the slowest can enhance controllability on forming the oxide film.

The silicon oxide films 16 and 18 may be each formed of a single film of a polycrystalline silicon film, silicon nitride film or the like or a laminate film thereof. Any material can be used therefor if it can embed the trench or the space between the pillars.

In case where the silicon pillar or silicon trench having the surface oriented in the specific crystal orientation is used for evaluating the plane orientation dependence or as a device, it may once be sacrificially oxidized, and then, may be used after removing the formed sacrificial oxide film.

The embodiments of the present invention represent the cases where the prism silicon pillar is used for evaluating the plane orientation and as the plane orientation reference pattern upon forming the thermal oxide film and the case where the prism silicon trench is applied for a device.

The prism silicon pillar may be applied for a device as it is or the prism silicon trench may be used for evaluating the plane orientation and as a plane orientation reference pattern upon forming the thermal oxide film. These are only examples in which the surface oriented in the specific crystal orientation is applied to a plane orientation evaluation of silicon or to a device producing utilizing the plane orientation dependence.

According to the present invention, at least one or more plane orientations can simultaneously and easily be evaluated on the same wafer as well as highly precise evaluation results can be obtained, without causing a theoretical deviation.

Moreover, a trench or a pillar having plane orientations all perfectly matched with one another can easily be manufactured. Therefore, a highly reliable semiconductor device can be obtained in which a troublesome process for matching plane orientations is eliminated and deviation in the properties of a device is prevented.

Specifically, according to the present invention, one or more plane orientations, i.e., the plane orientation dependence with respect to one or more properties can accurately and easily be evaluated on a semiconductor wafer.

Further, a pattern for obtaining a crystallographic reference orientation can be manufactured on the semiconductor wafer having plane (100).

Additionally, a prism trench having plane orientations all matched with one another can self-alignedly be obtained when a wafer whose plane orientation dependence has been evaluated is applied for a device.

What is claimed is:

1. A method for evaluating a plane orientation dependence of a semiconductor substrate comprising:
    forming a hard mask on a semiconductor substrate having plane orientation (100);
    anisotropically etching the semiconductor substrate with use of the hard mask as a mask to obtain a surface oriented in a specific crystal orientation, said anisotropic etching being of a reactive ion etching type; and
    evaluating a plane orientation dependence of properties of the semiconductor substrate by use of at least a portion of the surface oriented in the specific crystal orientation, wherein the evaluating step comprises forming a thermal oxide film on at least a prism-shaped pillar obtained by the reactive ion etching and simultaneously observing the thermal oxide film on both a surface having plane (100) and a surface having plane (110).

2. A method claimed in claim 1, wherein the evaluation of the plane orientation dependence is evaluation of a rate for forming a thermal oxidation film depending on the plane orientation of the semiconductor substrate.

3. A method claimed in claim 1, wherein said semiconductor substrate has a diamond crystal structure.

4. A method claimed in claim 1, wherein the surface oriented in a specific crystal orientation is of plane (100).

5. A method claimed in claim 1, wherein the hard mask is a circle or symmetric polygon.

6. A method claimed in claim 5, wherein anisotropically etching is performed to a depth of at least several times the size of the hard mask.

7. A method for aligning a photomask comprising:
    forming a hard mask on a semiconductor substrate having plane orientation (100);
    anisotropically etching the semiconductor substrate with use of the hard mask as a mask to obtain a pillar and/or trench having a surface oriented in a specific crystal orientation;
    aligning a photomask using the obtained surface of the pillar and/or trench as a reference pattern; and
    wherein two pillars and/or trenches are obtained in the form of prisms each having a surface oriented in a specific crystal orientation by anisotropic etching, the two pillars and/or trenches being separate from each other, the photomask has a pattern provided with two marks at a spaced interval, the two marks being in a parallel relation and each having two pairs of parallel sides, and the photomask is aligned by putting the sides of the marks of the photomask in parallel with the sides of the pillars and/or trenches.

8. A method for aligning a photomask comprising:
    forming a hard mask on a semiconductor substrate including plane orientation (100);
    anisotropically etching the semiconductor substrate with use of the hard mask as a mask to obtain a pillar and/or trench having a surface oriented in a specific crystal orientation;
    aligning a photomask using the obtained surface of the pillar and/or trench as a reference pattern; and
    wherein two pillars and/or trenches are obtained by anisotropic etching, the two pillars and/or trenches being separate from each other, the photomask has a pattern provided with two marks at a spaced interval, the two marks being in a substantially parallel relation and each having substantially parallel sides, and the photomask is aligned by putting the sides of the marks of the photomask substantially in parallel with the sides of the pillars and/or trenches.

* * * * *